United States Patent
Kang et al.

(10) Patent No.: US 12,482,749 B2
(45) Date of Patent: Nov. 25, 2025

(54) L-TYPE WORDLINE CONNECTION STRUCTURE FOR THREE-DIMENSIONAL MEMORY

(71) Applicant: Applied Materials, Inc., Santa Clara, CA (US)

(72) Inventors: Chang Seok Kang, Santa Clara, CA (US); Gill Yong Lee, San Jose, CA (US); Fred Fishburn, Apotos, CA (US); Tomohiko Kitajima, San Jose, CA (US); Sung-Kwan Kang, San Jose, CA (US); Sony Varghese, Manchester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 581 days.

(21) Appl. No.: 17/902,838

(22) Filed: Sep. 4, 2022

(65) Prior Publication Data

US 2023/0146831 A1    May 11, 2023

Related U.S. Application Data

(60) Provisional application No. 63/276,851, filed on Nov. 8, 2021.

(51) Int. Cl.
*H01L 23/528* (2006.01)
*H01L 21/768* (2006.01)
*H01L 23/535* (2006.01)

(52) U.S. Cl.
CPC .... *H01L 23/5283* (2013.01); *H01L 21/76816* (2013.01); *H01L 21/76895* (2013.01); *H01L 23/535* (2013.01)

(58) Field of Classification Search
CPC .......... H01L 23/5283; H01L 21/76816; H01L 23/5386; H10B 12/488; H10B 41/27;
(Continued)

(56) References Cited

U.S. PATENT DOCUMENTS

| 10,181,442 B1 | 1/2019 | Watanabe |
| 10,211,215 B1 * | 2/2019 | Ishii ........................ H10B 43/27 |

(Continued)

FOREIGN PATENT DOCUMENTS

| JP | 2017504217 A | 2/2017 |
| TW | 202123436 A | 6/2021 |

OTHER PUBLICATIONS

International Search Report and Written Opinion for the International Patent Application No. PCT/US2022/043184, mailed Jan. 2, 2023, 11 pages.

(Continued)

*Primary Examiner* — Ajay Ojha
*Assistant Examiner* — Sandra Milena Rodriguez Villanu
(74) *Attorney, Agent, or Firm* — KDW Firm PLLC

(57) ABSTRACT

A semiconductor manufacturing process for forming a three-dimensional (3D) memory structure and a semiconductor device having a 3D memory structure is described. The 3D memory structure comprises layers of memory cells with L shaped conductive layers where the L shaped conductive layers of each layer are coupled to metal lines disposed above the top or upper most layer such that the memory cells in each layer can be coupled to control circuitry.

9 Claims, 22 Drawing Sheets

(58) Field of Classification Search
CPC ........ H10B 43/27; H10B 41/50; H10B 43/50;
H10B 12/50; H10B 12/09; H10B 12/48;
H10B 41/40; H10B 43/40; G11C 5/06
See application file for complete search history.

(56) References Cited

U.S. PATENT DOCUMENTS

| | | |
|---|---|---|
| 10,217,746 B1 | 2/2019 | Kim |
| 2008/0099819 A1 | 5/2008 | Kito |
| 2012/0322252 A1 | 12/2012 | Son |
| 2015/0206587 A1 | 7/2015 | Hasegawa |
| 2018/0261611 A1 | 9/2018 | Norizuki |
| 2020/0357811 A1 | 11/2020 | Kim |
| 2021/0104531 A1 | 4/2021 | Guo |

OTHER PUBLICATIONS

Gwan Hyeob Koh, Challenges and Prospects of Memory Scaling—Presentation, 2020 Symposia on VLSI Technology and Circuits, 50 pages.

\* cited by examiner

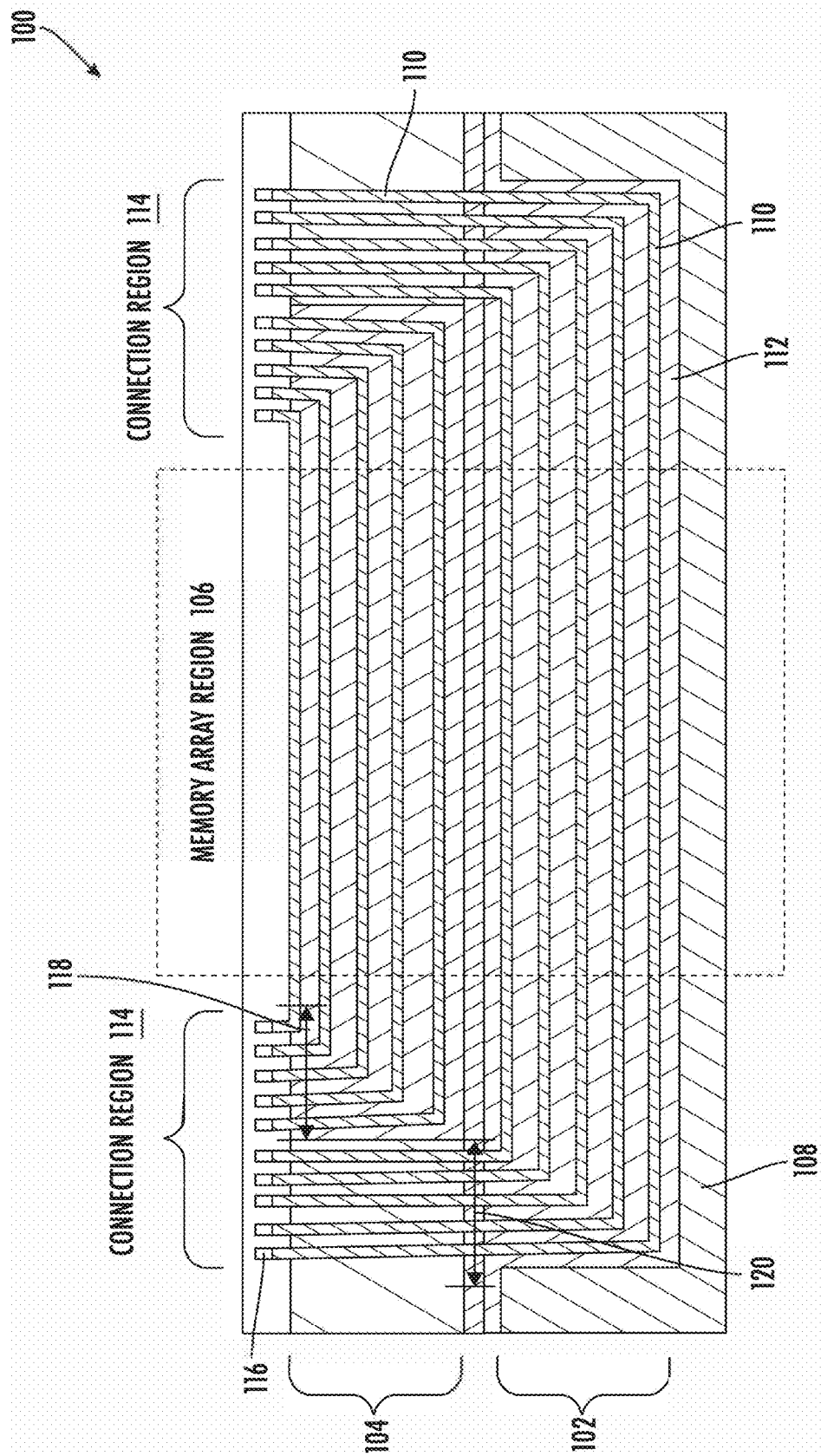

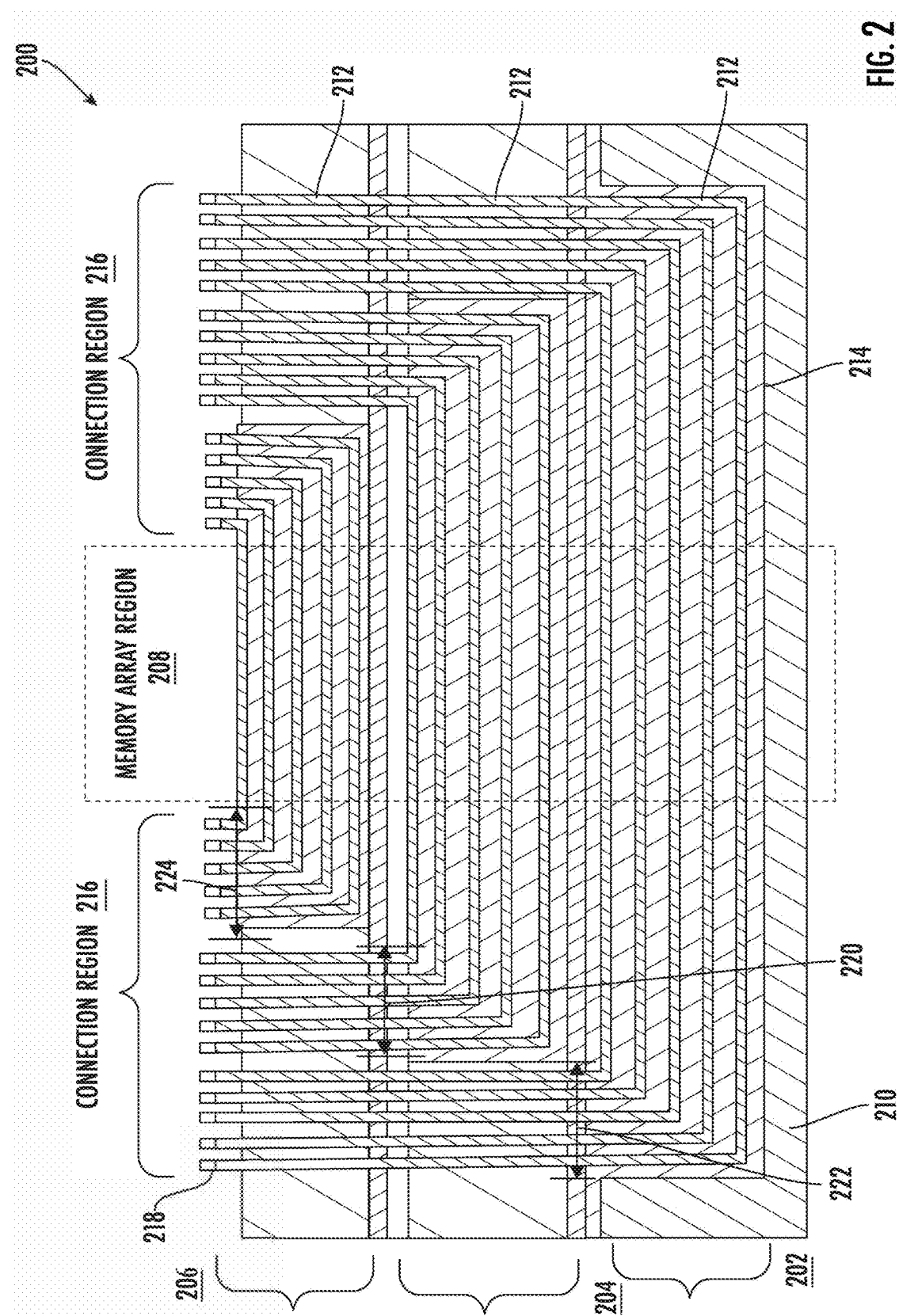

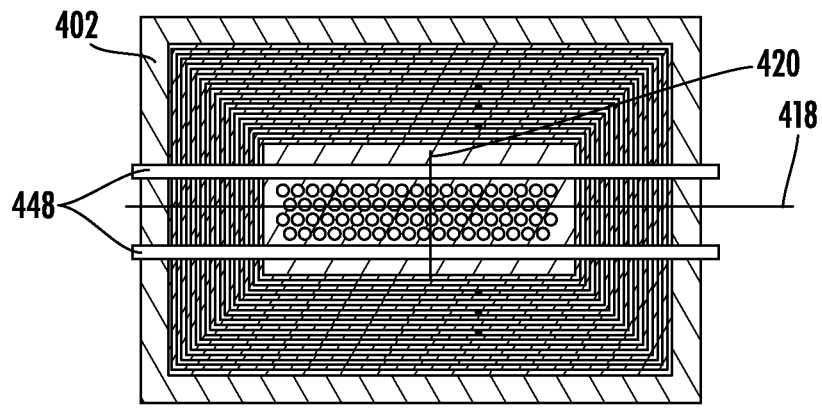
FIG. 4Z
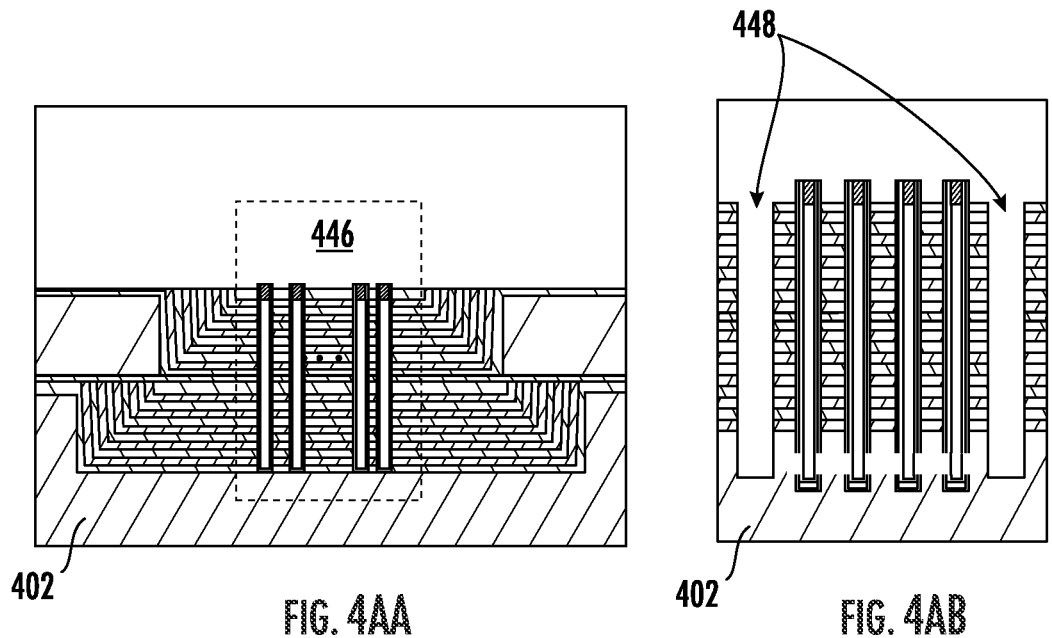
FIG. 4AA
FIG. 4AB

L-TYPE WORDLINE CONNECTION STRUCTURE FOR THREE-DIMENSIONAL MEMORY

CROSS-REFERENCE TO RELATED APPLICATION

The present application claims priority to U.S. Provisional patent application Ser. No. 63/276,851, filed Nov. 8, 2021, entitled "L-TYPE WORDLINE CONNECTION STRUCTURE FOR THREE-DIMENSIONAL MEMORY", and incorporated by reference herein in its entirety.

FIELD OF THE DISCLOSURE

The present description, example embodiments, and claims relate to semiconductor devices and particularly to three-dimensional (3D) memory devices.

BACKGROUND OF THE DISCLOSURE

Three-dimensional (3D) memory device architectures provide that multiple unit pairs are stacked on a substrate. To provide access to each unit cell of the stacks, conductor layers need to be formed and exposed to allow connection of the unit cells of each unit pair with control circuits. Conventionally, conductor layers for 3D memory devices are formed with steps disposed on either side of the stacked unit pairs. However, as will be appreciated by those of ordinary skill in the art, this consumes a significant amount of device area. As such, there is a need to provide a 3D structure for stacking multiple unit pairs.

BRIEF SUMMARY

Brief Description of the Several Views of the Drawings

To easily identify the discussion of any particular element or act, the most significant digit or digits in a reference number refer to the figure number in which that element is first introduced. Furthermore, like numbering represents like elements.

The drawings are merely representations, not intended to portray specific parameters of the disclosure and are not necessarily to scale. The drawings are intended to depict exemplary embodiments of the disclosure, and therefore are not be considered as limiting in scope.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

FIG. 1 illustrates a two-layer 3D memory device in accordance with embodiment(s) of the present disclosure.

FIG. 2 illustrates a three-layer 3D memory device in accordance with embodiment(s) of the present disclosure.

Figure 3A:
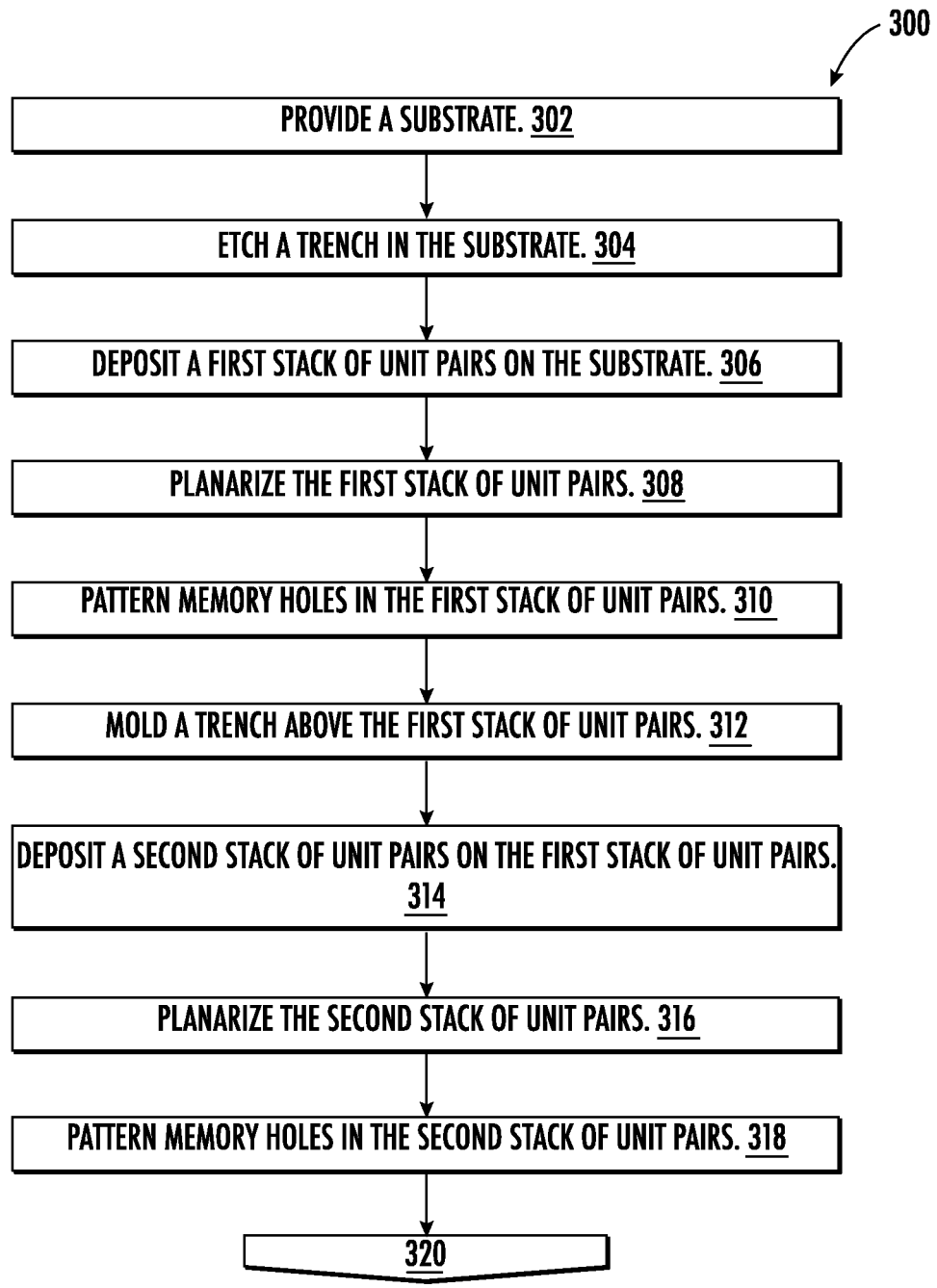
Figure 3B:
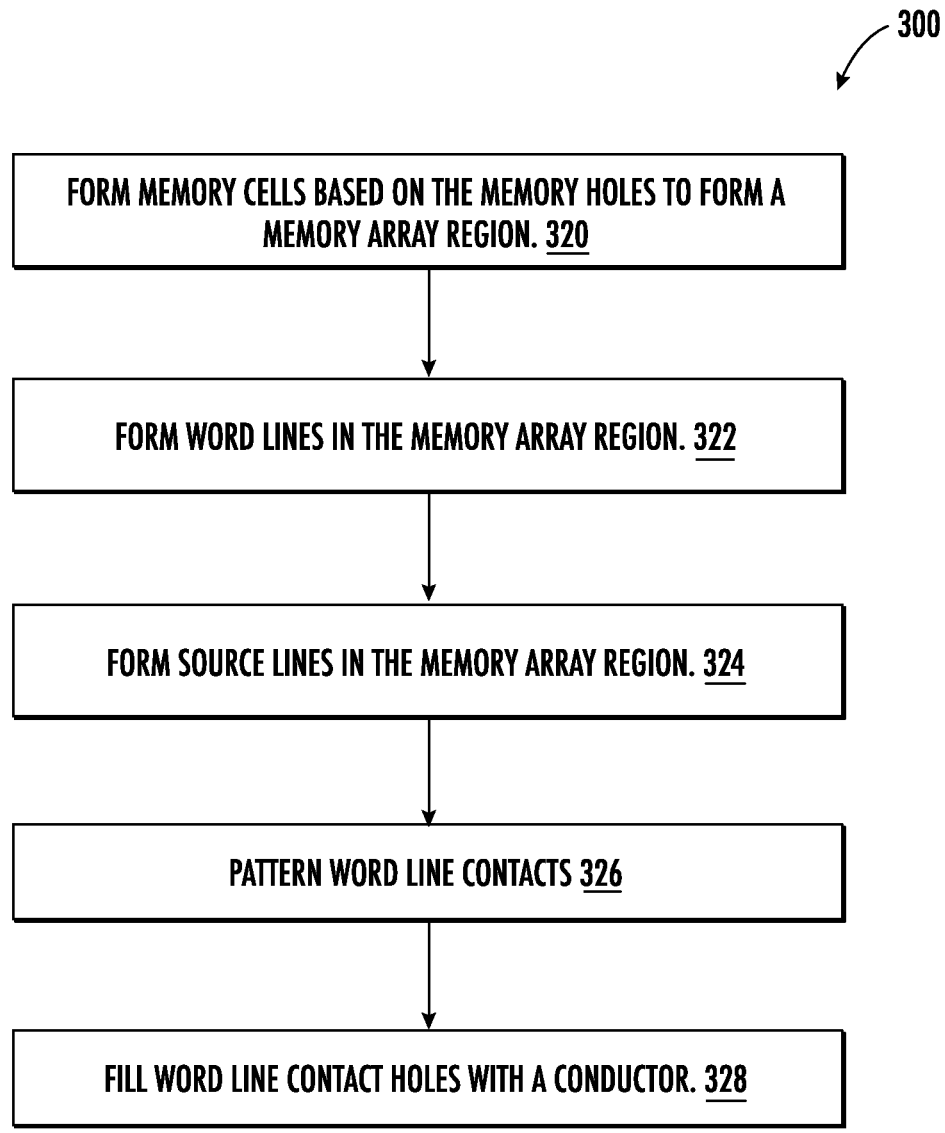

FIG. 3A and FIG. 3B illustrate a method for fabricating a 3D memory device in accordance with embodiment(s) of the present disclosure.

Figure 4A:
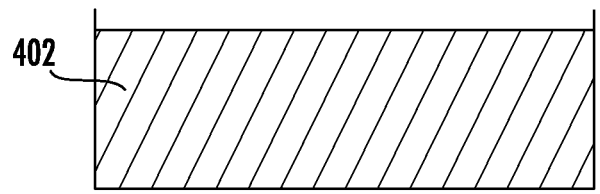

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N, FIG. 4O, FIG. 4P, FIG. 4Q, FIG. 4R, FIG. 4S, FIG. 4T, FIG. 4U, FIG. 4V, FIG. 4W, FIG. 4X, FIG. 4Y, FIG. 4Z, FIG. 4AA, FIG. 4AB, FIG. 4AC, FIG. 4AD, FIG. 4AE, FIG. 4AF, FIG. 4AG, FIG. 4AH, FIG. 4AI, and FIG. 4AJ illustrate a 3D memory device at various stages of fabrication in accordance with embodiment(s) of the present disclosure.

Figure 5:
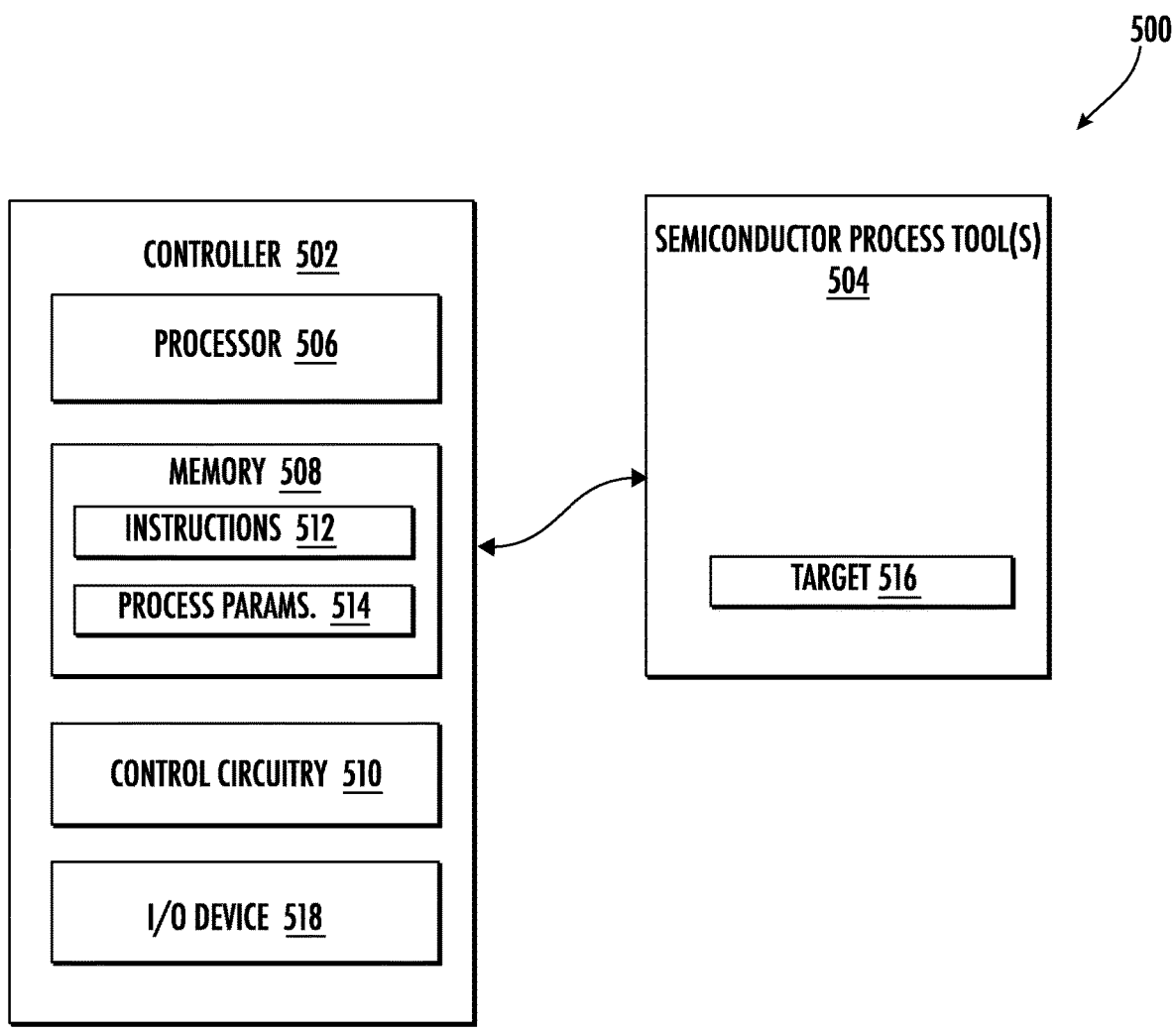

FIG. 5 illustrates a semiconductor manufacturing system 500, in accordance with embodiment(s) of the present disclosure.

Figure 6:
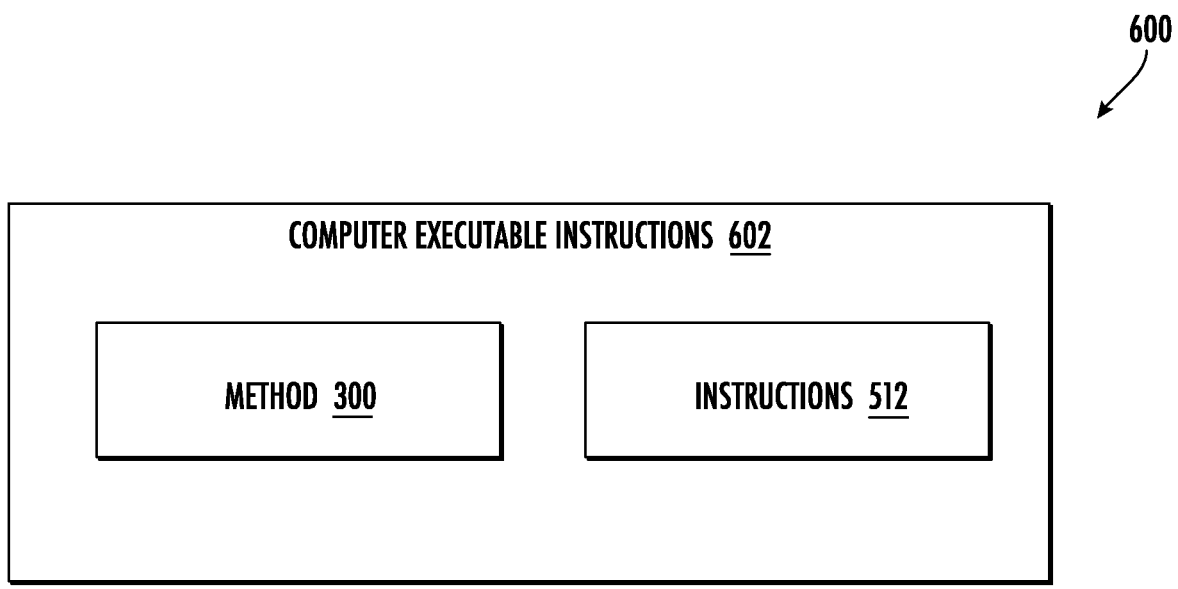

FIG. 6 illustrates a computer-readable storage medium in accordance with embodiment(s) of the present disclosure.

DETAILED DESCRIPTION

Methods, devices, and systems in accordance with the present disclosure will now be described more fully hereinafter with reference to the accompanying drawings, where various embodiments are shown. The methods, devices, and systems may be embodied in many different forms and are not to be construed as being limited to the embodiments set forth herein. Instead, these embodiments are provided so the disclosure will be thorough and complete, and will fully convey the scope of the described methods and devices to those skilled in the art.

As mentioned above, there is a need for an improved 3D memory structure that exposes the conductors for stacks of multiple unit pairs. FIG. 1 illustrates a cut-away side view of a 3D memory device 100, in accordance with non-limiting example(s) of the present disclosure. 3D memory device 100 includes a first layer 102 and a second layer 104 of memory cells (not shown) formed in memory array region 106. It is noted that layers of memory cells are sometimes referred to as stacks. However, for clarity in referring to the entire stack of a 3D memory device or referring to individual "layers" of the 3D memory device, the term layers is often used herein. In general, the memory cells of first layer 102 are formed on substrate 108 by conductors 110 and insulators 112 while the memory cells of second layer 104 are formed on first layer 102 by conductors 110 and insulators 112. The conductors 110 associated with the memory cells of both first layer 102 and second layer 104 are exposed on a top surface of 3D memory device 100 at connection regions 114 and can be coupled to metal line 116 to electrically connect the memory cells to control circuitry (not shown).

The memory cells in 3D memory device 100 are formed using an L-type (or L-shaped) structure with a number of pairs of conductors 110. The L-type structure of the second layer 104 is formed over the L-type structure of the first layer 102. As can be seen, the width 118 of the L-type structure of the second layer 104 in connection region 114 is reduced by at least two times (2×) the width 120 of the L-type structure of the first layer 102.

This structure and method of manufacture of the present disclosure can be applied to stacking memory cells of more than two layers. For example, FIG. 2 illustrates a 3D memory device 200, in accordance with non-limiting example(s) of the present disclosure. 3D memory device 200 is similar to 3D memory device 100 in that includes layers of memory cells with L-type connection structure. However, 3D memory device 200 includes three (3) layers as opposed to the two (2) layers of 3D memory device 100. Specifically, 3D memory device 100 includes a first layer 202, a second layer 204, and a third layer 206. The layers define memory cells (not shown) formed in memory array region 208. In general, the memory cells of first layer 202 are formed on substrate 210 by conductors 212 and insulators 214; the memory cells of second layer 204 are formed on first layer 202 by conductors 212 and insulators 214; and the memory cells of the third layer 206 are formed on the second layer 204 by conductor 212 and insulators 214. The conductors 212 associated with the memory cells of each of the first layer 202, the second layer 204, and the third layer 206 are exposed on a top surface of 3D memory device 200 at connection regions 216 and can be coupled to metal line 218 to electrically connect the memory cells to control circuitry (not shown).

The memory cells in 3D memory device 200 are formed using an L-type structure with a number of pairs of conductors 212. The width 220 of the L-type structure of the second layer 204 in connection region 216 is reduced by at least two times (2×) the width 222 of the L-type structure of the first layer 202 while the width 224 of the L-type structure of the third layer 206 is reduced by at least 2× the width 220 of the L-type structure of the second layer 204.

Figure 4B:
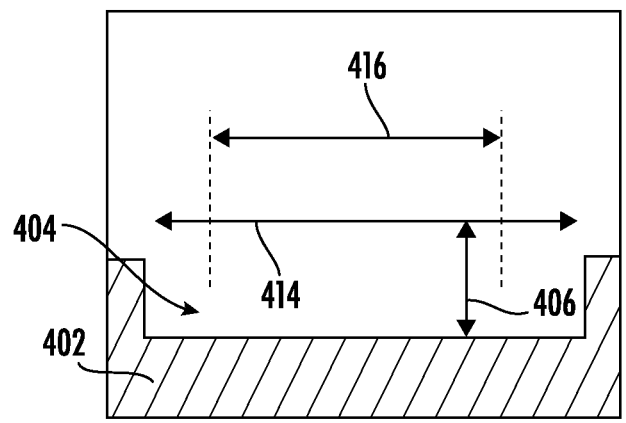
Figure 4C:
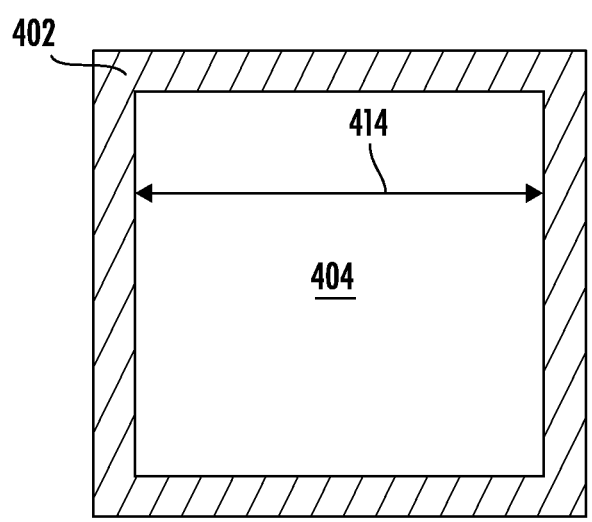
Figure 4E:
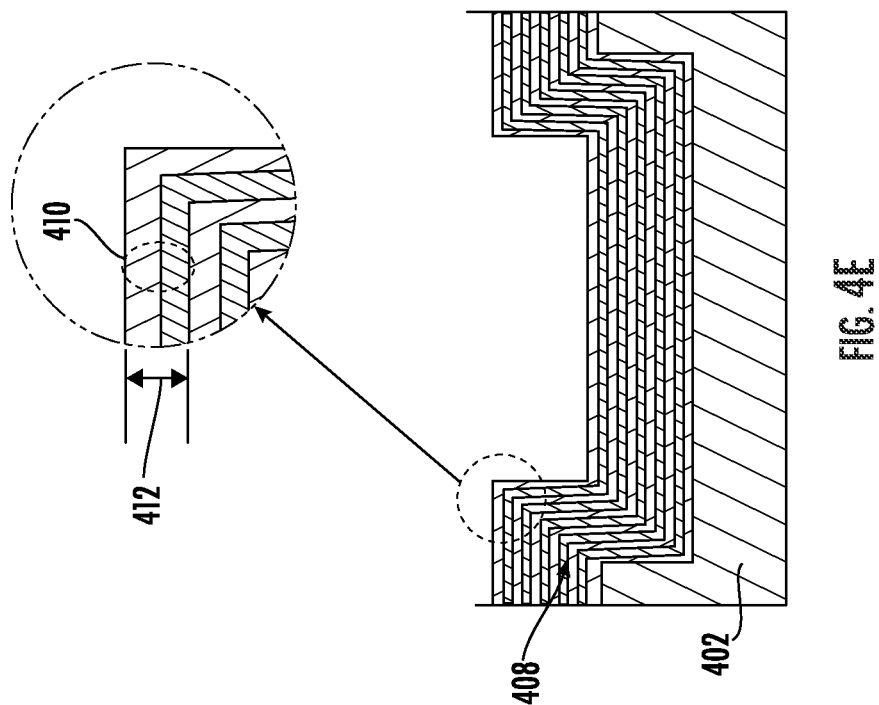

FIG. 3A and FIG. 3B illustrate a method 300 for fabricating a 3D memory device, in accordance with embodiment(s) of the present disclosure. Method 300 is described with reference to FIG. 4A to FIG. 4AJ. In general, FIG. 4A to FIG. 4W depicts forming the L-type structures of each layer (or stack) of alternating layers of conductors and insulators while FIG. 5A (deleted) to FIG. 5B (deleted) depicts processing the overall structure to form arrays of memory cells within each layer and connecting the memory cells of the lower layers to the upper surface metal lines. It is noted that the present disclosure can be applied to form numerous types of memory devices having a variety of types of memory arrays, such as, a dynamic random-access memory (DRAM) array, a flash memory array, such as a not and (NAND) memory array, or the like. The specific arrays of memory cells formed are not limited by the following description. The concepts described herein, however, can be implemented to expose lower layers of a 3D memory device (e.g., 3D memory device 100, 200, or the like) to connect them with signal lines.

Method 300 can begin on block 302 "provide a substrate" where a semiconductor substrate can be provided. Continuing to block 304 "deposit alternating layers of silicon oxide and silicon nitride on the substrate to form a lower deck" alternating layers of silicon material can deposited on a substrate (not shown). For example, FIG. 4A shows a substrate 402, which can be any of a variety of semiconductor substrates (e.g., crystalline silicon (c-Si), etc.).

Continuing to block 304 "etch a trench in the substrate" a region of the substrate 402 is removed, for example with a dry etch process. For example, FIG. 4B illustrates a side-cut away view of substrate 402 while FIG. 4C illustrates a top view of substrate 402 with trench 404 etched in substrate 402. In some embodiments, the depth 406 of the trench 404 can be substantially equal to the number of unit pairs (e.g., a conductor and insulator pair) in the first layer of the 3D memory device being manufactured multiplied by the thickness of each unit pair. FIG. 4E depicts a unit pair 410 having a thickness 412. With some embodiments, the depth 406 is between 10 and 100 nanometers (nm) while there are between 10 and 1000 unit pairs 410.

Additionally, the width 414 (or critical dimension) of the trench 404 can be substantially equal to the length 416 of the memory array portion of the first layer plus the number of unit pairs 410 multiplied by the thickness of each unit pair 410 multiplied by 4. Said differently, the width 414 of the trench 404 can be substantially equal to the length 416 plus two (2) times the depth 406 of the trench 404.

Continuing to block 306 "deposit a first stack of unit pairs on the substrate" a first number of unit pairs are deposited on the substrate 402 over the region of the trench 404. A stack 408 of unit pairs 410 can be deposited onto substrate 402, for example, via a chemical vapor deposition (CVD) process, or the like. In some embodiments, each unit pair 410 can comprise silicon oxide (SiO) film and a silicon nitride (SiN) film, each having a thickness between 10 and 50 nm.

Figure 4D:
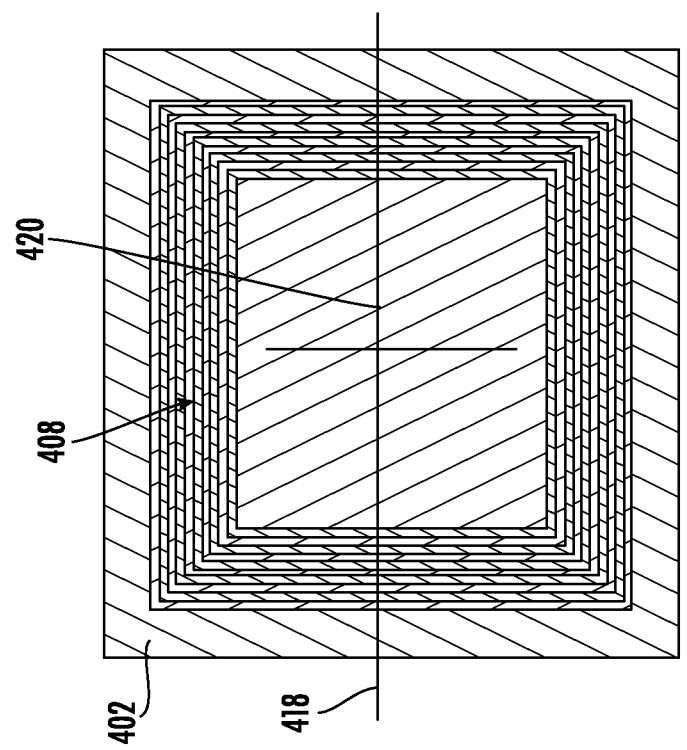
Figure 4G:
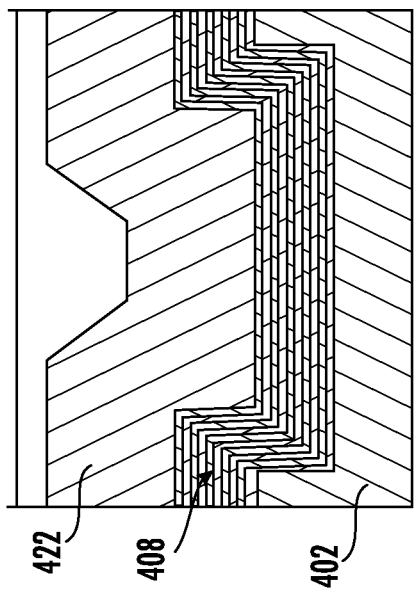
Figure 4F:
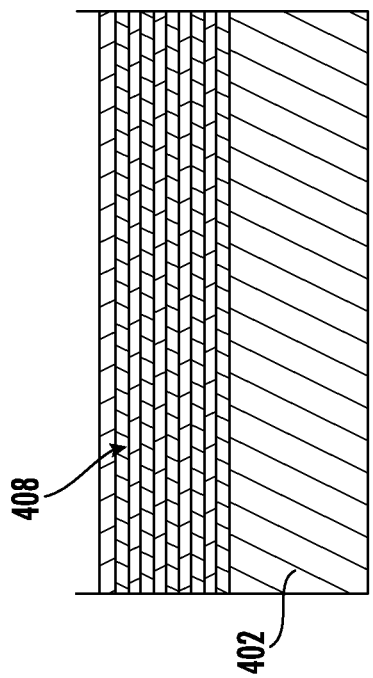

FIG. 4D illustrates a top view of the substrate 402 with a stack 408 of unit pairs 410 deposited onto the substrate 402 covering trench 404. FIG. 4E and FIG. 4F illustrate cut-away side views of substrate 402 showing stack 408. In particular, FIG. 4E shows a cut-away side view of substrate 402 along cut 418 while FIG. 4F shows a cut-away side view of substrate 402 along cut 420.

Continuing to block 308 "planarize the first stack of unit pairs" the first stack 408 of unit pairs 410 can be planarized, for example using a chemical mechanical planarization (CMP) process, or the like. In some embodiments, an insulator 422 (e.g., SiO, or the like) can be deposited over stack 408 and then the structure flattened (or planarized) to expose the unit pairs 410 at the sides of the trench 404. For example, FIG. 4G illustrates a cut-away side view (e.g., at cut 418) showing insulator 422 deposited over stack 408 while FIG. 4H illustrates a cut-away side view (e.g., at cut 418) showing the stack 408 planarized to remove the portions of unit pairs 410 on the surface of substrate 402, thereby exposing the unit pairs 410.

Figure 4I:
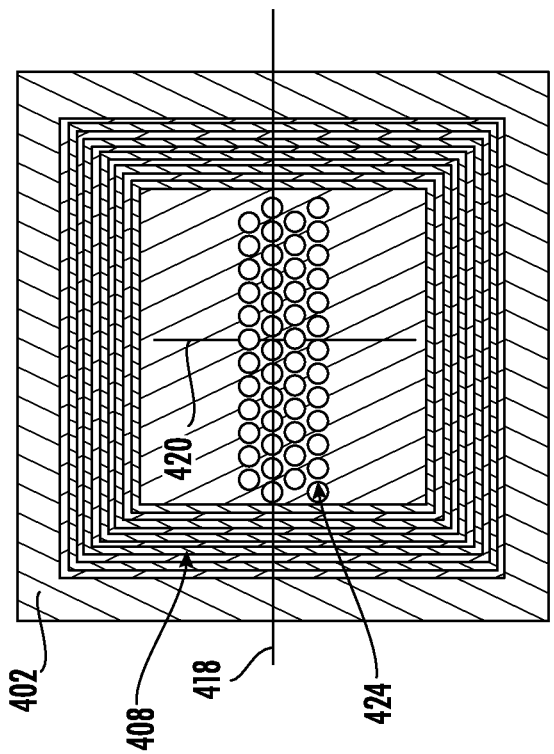
Figure 4I:
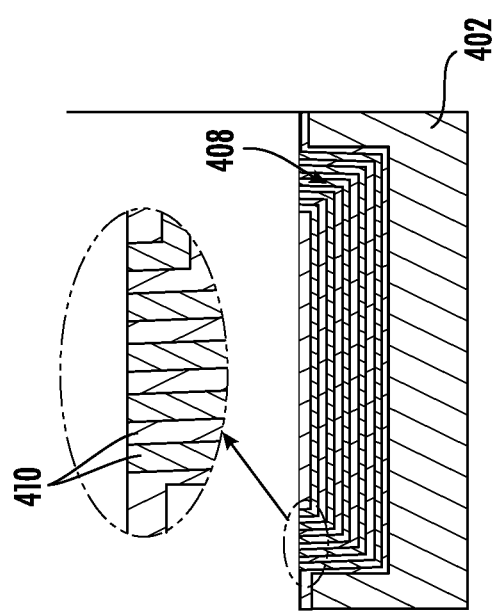
Figure 4J:
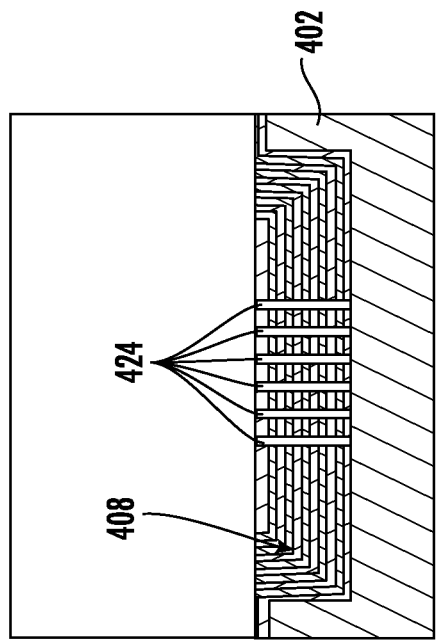
Figure 4K:
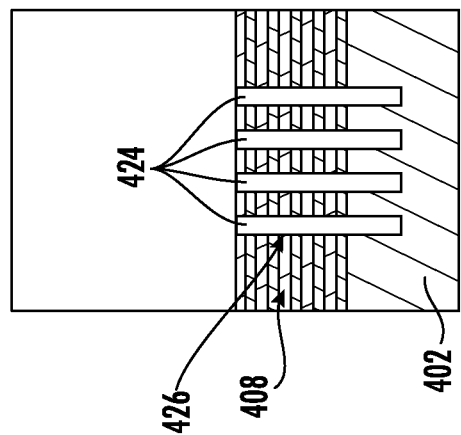

Continuing to block 310 "pattern memory holes in the first stack of unit pairs" memory holes 424 are patterned in the first stack 408 of unit pairs 410. In some embodiments, memory holes 424 can be formed using an etch (dry, wet, or the like) process. For example, FIG. 4I illustrates a top view of stack 408 formed on substrate 402 with memory holes 424 formed in the stack 408. FIG. 4J and FIG. 4K show cut-away side views of substrate 402 with stack 408 formed thereon and memory holes 424 formed in stack 408. In particular, FIG. 4J shows the cut-away side view of the structure along cut 418 while FIG. 4K shows the cut-away side view of the structure along cut 420. In some embodiments, at block 310, memory holes can be filled with a sacrificial material 426 (e.g. carbon, or the like).

Figure 4M:
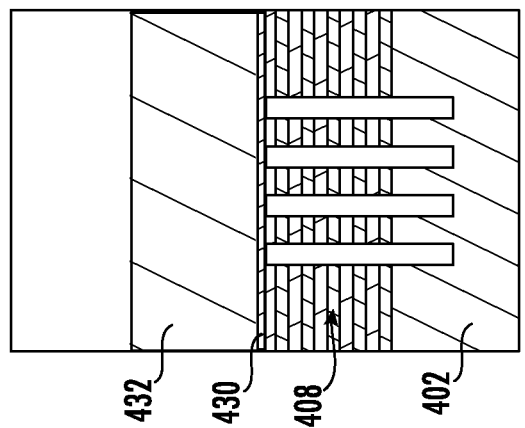
Figure 4L:
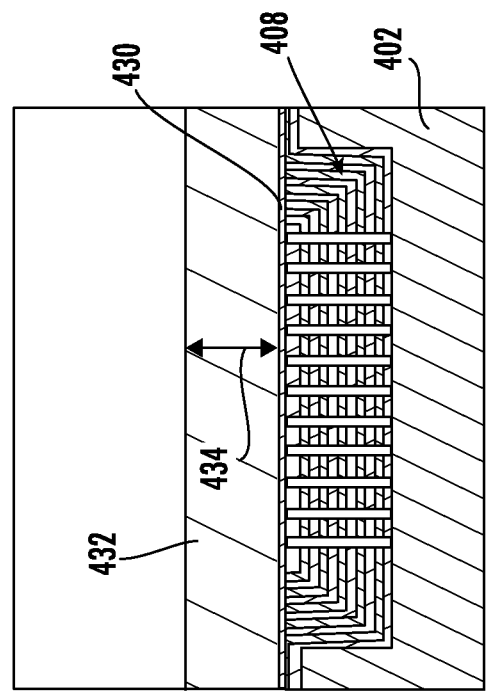

Continuing to block 312 "mold a trench above the first stack of unit pairs" a trench 428 is molded above the first stack 408 of unit pairs 410. With some embodiments, the trench 428 can be molded in a molding material (e.g., SiO, or the like). In particular, an etch stop layer 430 can be deposited over the planarized stack 408 having memory holes 424 (filled with sacrificial material 426) formed therein and then a mold material 432 deposited over the etch stop layer 430. FIG. 4L and FIG. 4M illustrate cut-away side views along cuts 418 and 420 respectively. In particular, FIG. 4L and FIG. 4M illustrate the substrate 402 having stack 408 of unit pairs 410 formed thereon and further having memory holes 424 formed in the stack 408 with an etch stop layer 430 deposited over the stack 408 and mold material 432 deposited over the etch stop layer 430. In some embodiments, the depth 434 of the mold material 432 can be substantially equal to the number of unit pairs (e.g., a conductor and insulator pair) in the second layer of the 3D memory device being manufactured multiplied by the thickness of each unit pair, for example, 10 to 100 nm.

Figure 4O:
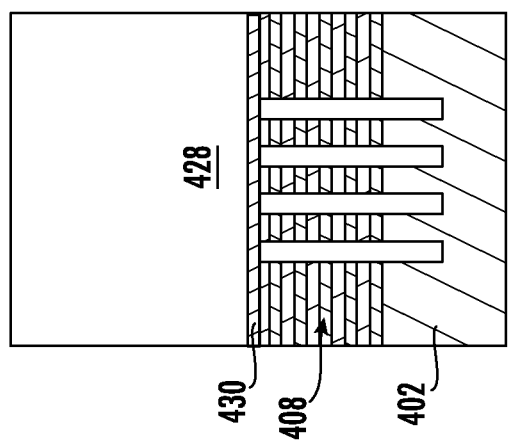
Figure 4M:
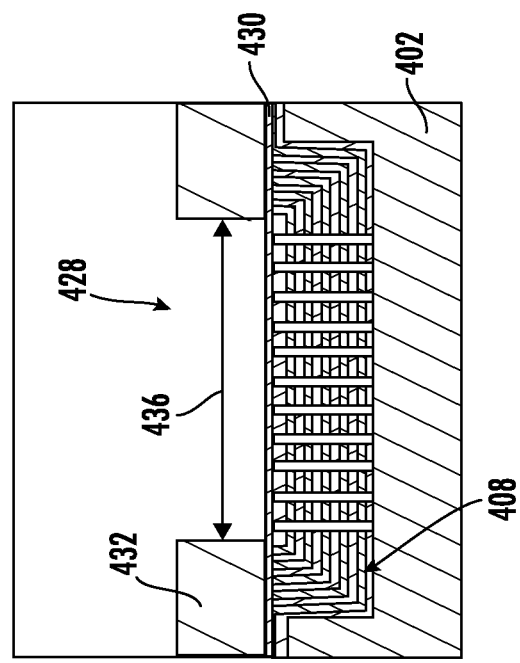

Additionally, at block 312, the trench 428 can be etched in the mold material 432, for example, using a reactive-ion etching (RIE) process using a mask. FIG. 4N and FIG. 4O illustrate cut-away side views along cuts 418 and 420 respectively. In particular, FIG. 4N and FIG. 4O illustrate the substrate 402 having stack 408 of unit pairs 410 formed and a trench 428 formed in mold material 432 above stack 408 of unit pairs 410. With some embodiments, the width 436 of the trench 428 can be substantially equal to the length of the memory array portion of the second layer plus the number of unit pairs 410 multiplied by the thickness of each unit pair 410 multiplied by 2. Said differently, the width 436 of the trench 428 can be substantially equal to the length of the memory array portion of the second layer plus the depth 434 of the trench 428, which as depicted, is smaller than the width 414 of the trench 404.

Figure 4P:
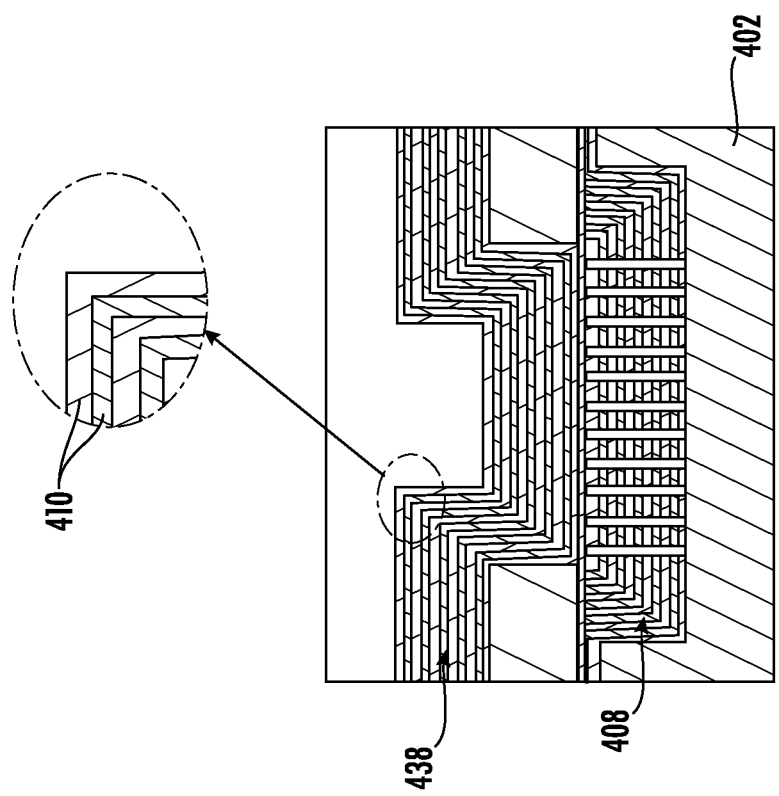
Figure 4Q:
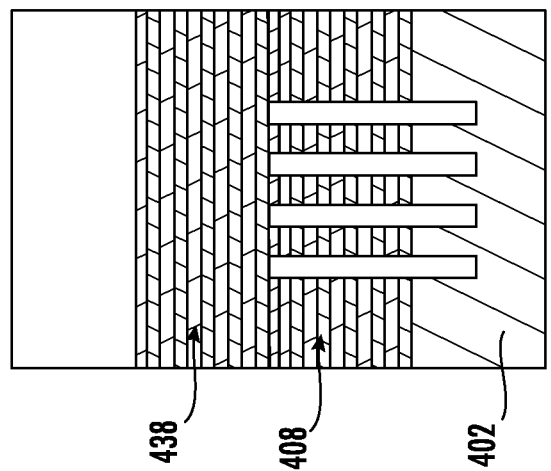

Continuing to block 314 "deposit a second stack of unit pairs on the first stack of unit pairs" a second number of unit pairs 410 are deposited on the stack 408 of unit pairs 410 over the region of the trench 428 to form stack 438. That is, stack 438 of unit pairs 410 can be deposited onto stack 408, for example, via a CVD process, or the like. FIG. 4P illustrates a cut-away side view (along cut 418) of the substrate 402 with a stack 408 of unit pairs 410 deposited onto the substrate 402 and stack 438 of unit pair 410 deposited onto stack 408. Similarly, FIG. 4Q illustrates cut-away side view (along cut 420) of substrate 402 with stack 408 of unit pairs 410 deposited onto the substrate 402 and stack 438 of unit pairs 410 deposited onto stack 408.

Figure 4S:
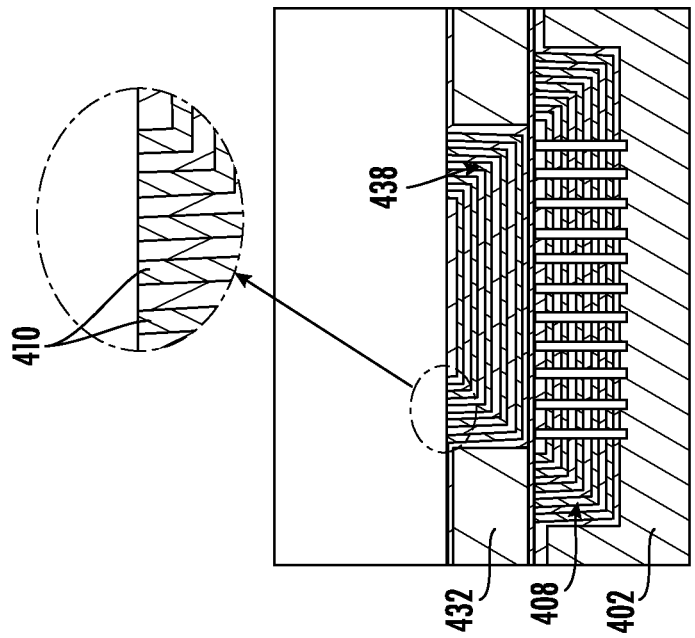
Figure 4R:
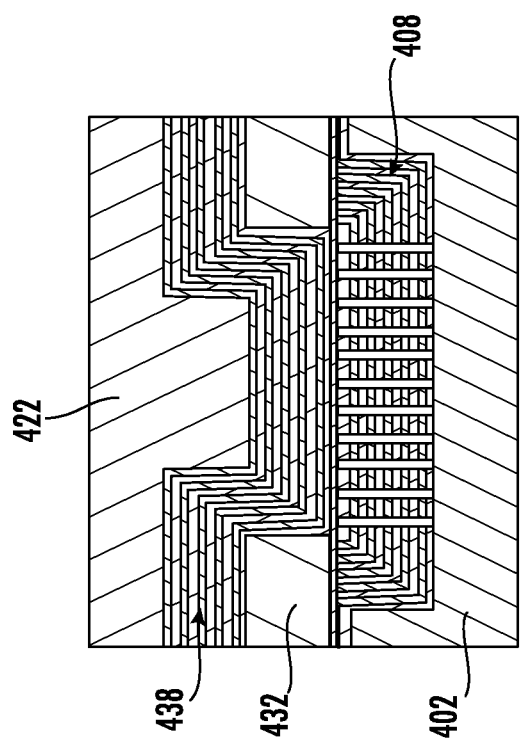

Continuing to block 316 "planarize the second stack of unit pairs" the second stack 438 of unit pairs 410 can be planarized, for example using a chemical mechanical planarization (CMP) process, or the like. In some embodiments, insulator 422 (e.g., SiO, or the like) can be deposited over stack 438 and then the structure flattened (or planarized) to expose the unit pairs 410 at the sides of the trench 428. For example, FIG. 4R illustrates a cut-away side view (e.g., at cut 418) showing insulator 422 deposited over stack 438 while FIG. 4S illustrates a cut-away side view (e.g., at cut 418) showing the stack 438 planarized to remove the portions of unit pairs 410 on the surface of mold material 432, thereby exposing the unit pairs 410.

Figure 4T:
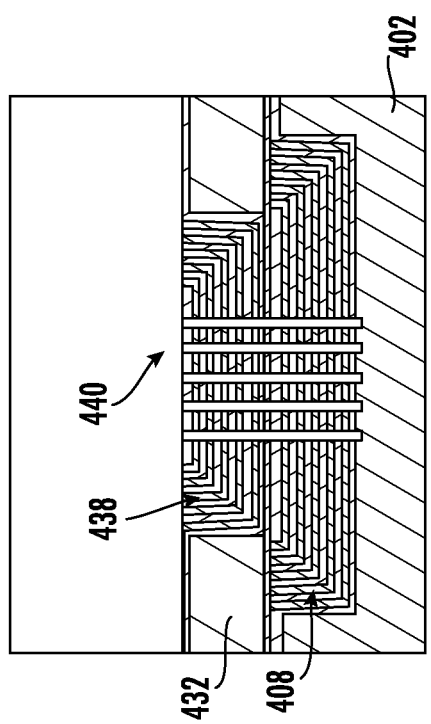
Figure 4U:
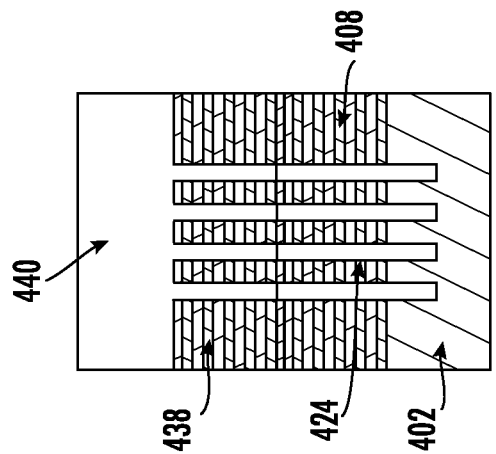
Figure 4W:
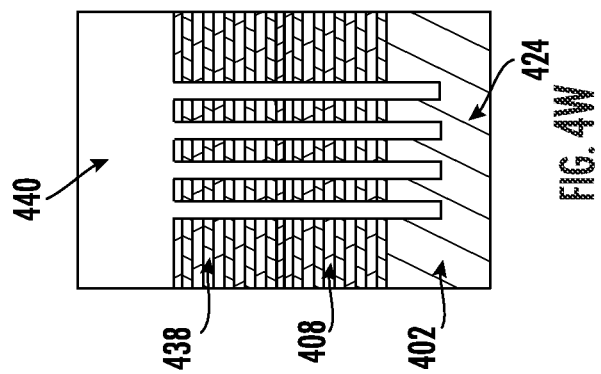

Continuing to block 318 "pattern memory holes in the second stack of unit pairs" memory holes 440 are patterned in the second stack 438 of unit pairs 410. In some embodiments, memory holes 440 can be formed using an etch (dry, wet, or the like) process. For example, FIG. 4T illustrates a cut-away side view (along cut 418) showing the structure having memory holes 440 formed in the stack 438 above and in line with memory holes 424. Likewise, FIG. 4U shows a cut-away side view (along cut 420) showing the structure having memory holes 440 formed in the stack 438 above and in line with memory holes 424. In some embodiments, at block 318, the sacrificial material 426 can be removed (e.g., using a ashing process in ambient oxygen, or the like).

Figure 4V:
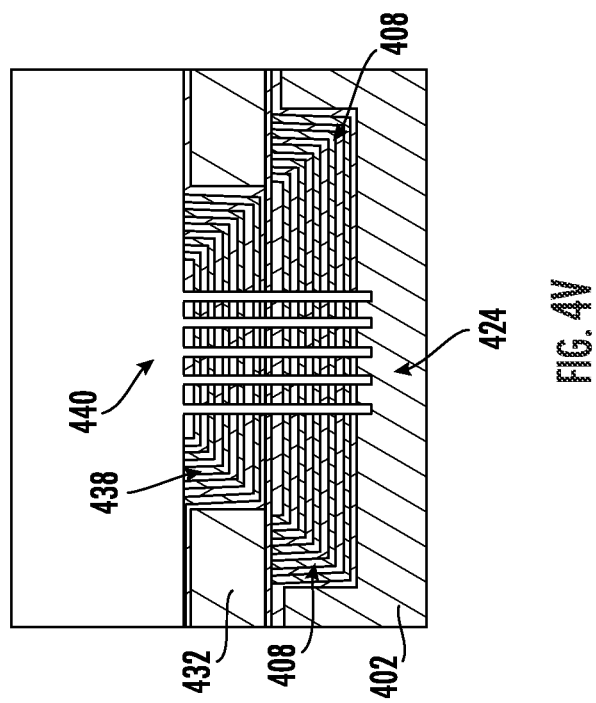

Accordingly, lower and upper stacks 408 and 438, respectively, with unit pairs 410 having an L-type structure and further with memory holes (e.g., memory holes 424 and 440) aligned therein can be formed as described above. Cut-away side views of this completed structure are depicted in FIG. 4V, which shown the structure along cut 418 and FIG. 4W, which shows the structure along cut 420.

Figure 4X:
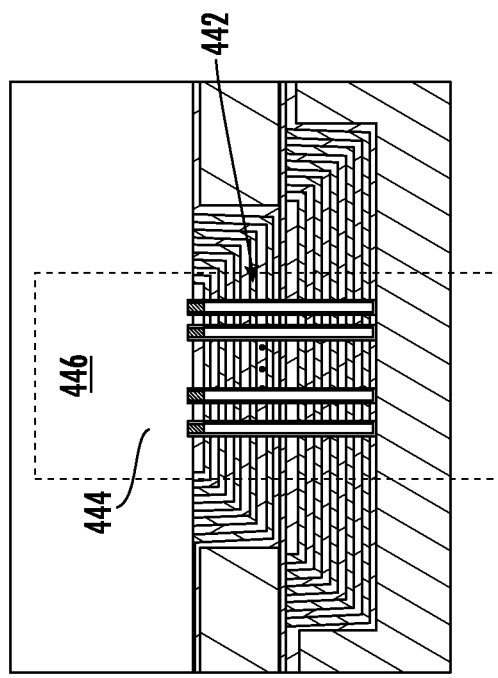
Figure 4Y:
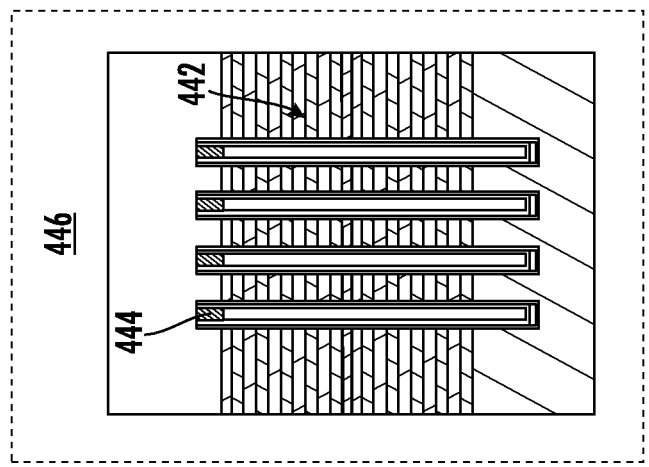
Figure 4A:
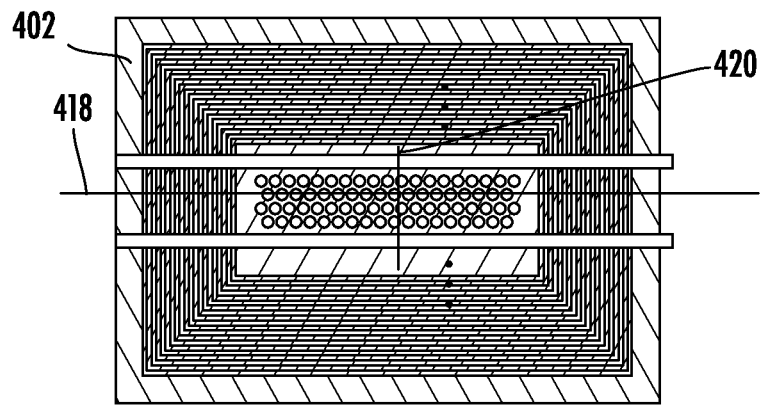
Figure 4A:
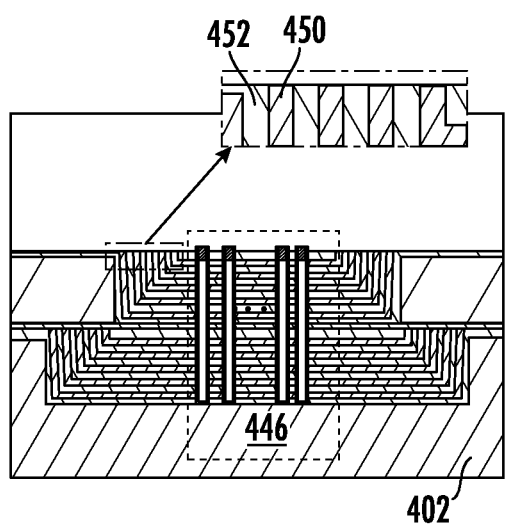
Figure 4A:
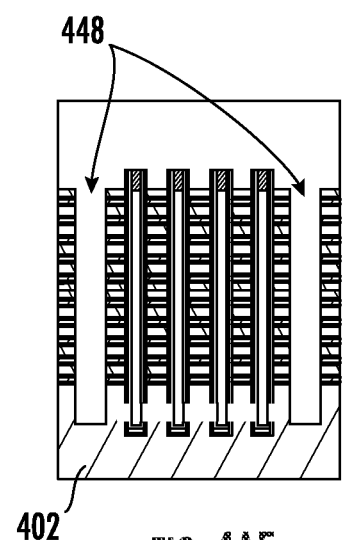
Figure 4A:
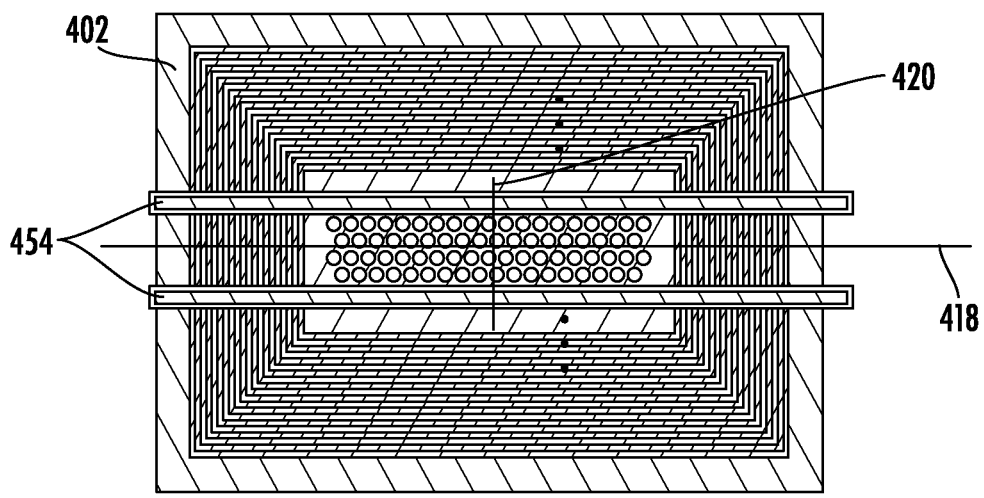
Figure 4A:
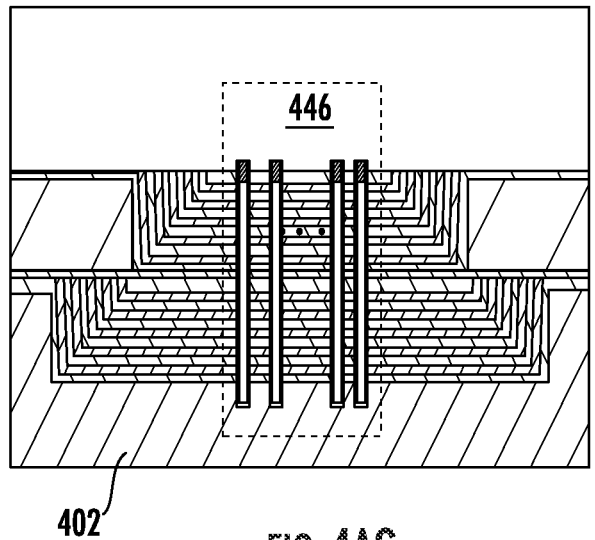
Figure 4A:
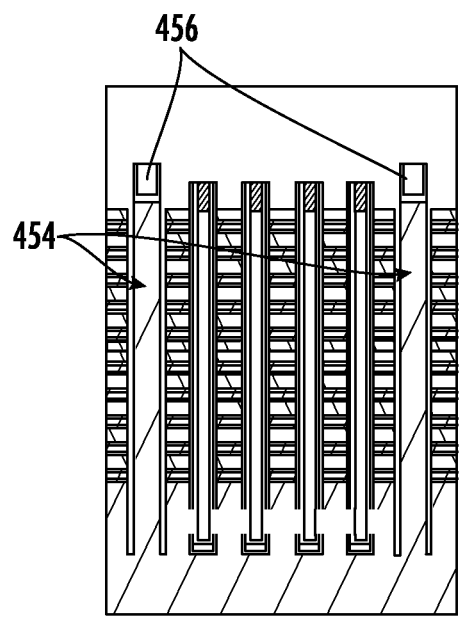
Figure 4A:
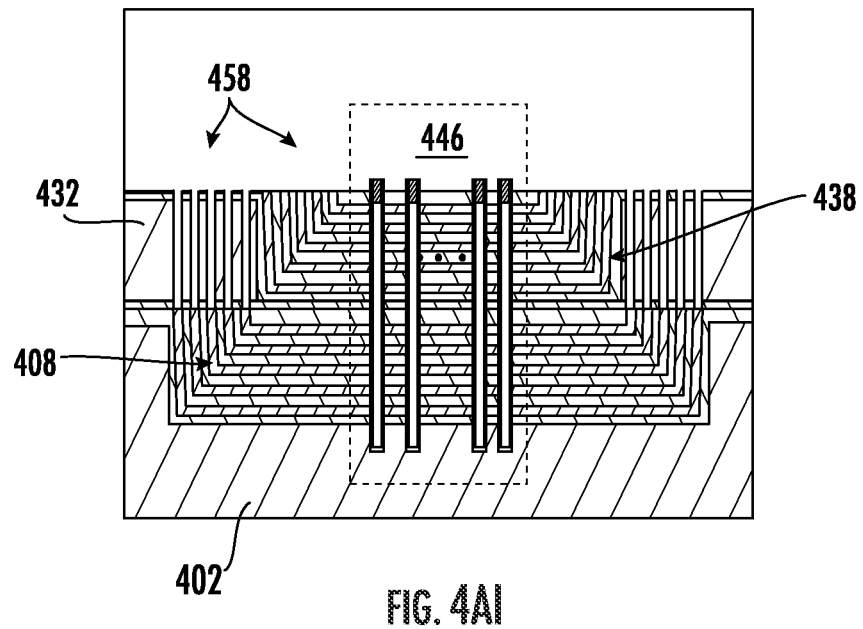
Figure 4A:
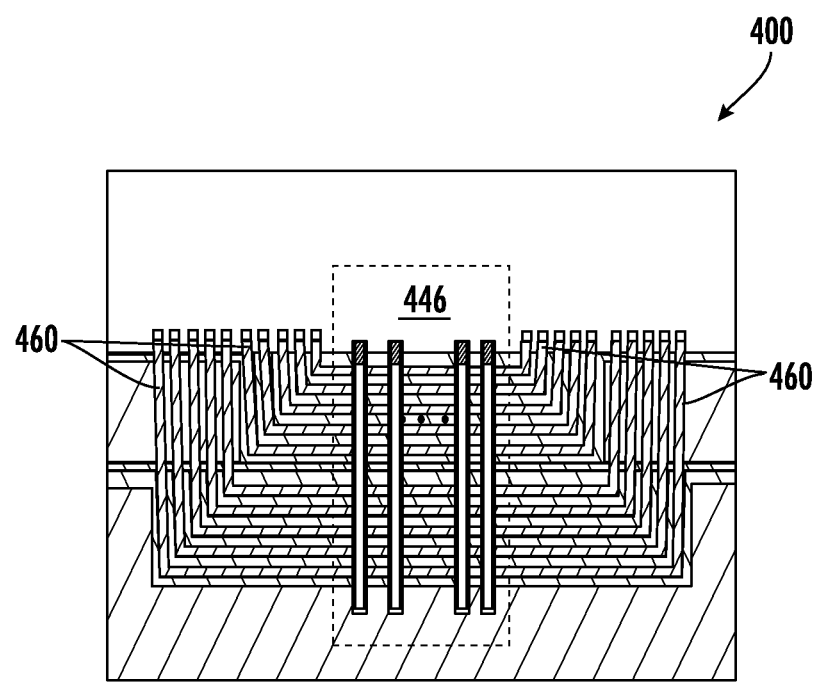

Method 300 continues to block 320, which is more fully depicted in FIG. 3B. At block 320 "form memory cells based on the memory holes to form a memory array region" memory cells 442 are formed from memory holes 424 and memory holes 440 to form a memory array region 446. In some implementations, lower memory holes 424 and upper memory holes 440 can be filled with a combination of SiO, SiN, and polysilicon to form an "ONOP" structure while a bit line (BL) contact 444 can be formed on the upper memory holes 440. For example, FIG. 4X depicts a cut-away side view (along cut 418) of the structure with memory array region 446 including memory cells 442 formed from memory holes 424 and memory holes 440 and having BL contacts 444. Likewise, FIG. 4Y depicts a cut-away side view (along cut 420) of the structure with memory array region 446 including memory cells 442 formed from memory holes 424 and memory holes 440 and having BL contacts 444.

Continuing to block 322 "form word lines in the memory array region" wordlines are formed in the memory array region 446. In some embodiments, channels or slits 448 are patterned in the structure to provide access to replace one of the layer types of the unit pair 410 (e.g., SiN) with a conductor (e.g., tungsten (W)). For example, slits 448 can be etched in the structure and the SiN layers in 410 of both stack 408 and stack 438 removed (e.g., using phosphoric acid, or the like).

For example, FIG. 4Z illustrates a top view of the structure with slits 448 patterned therein while FIG. 4AA and FIG. 4AB illustrate cut-away side views of the structure along cuts 418 and 420, respectively, also showing slits 448 patterned therein. FIG. 4AC illustrates a top view of the structure showing the SiN layer of unit pair 410 removed and replaced with a conductor 450 (e.g., W) while FIG. 4AD and FIG. 4AE illustrate cut-away side views of the structure along cuts 418 and 420, respectively, showing the SiN layer of unit pair 410 removed and replaced with a conductor 450 (e.g., W) leaving unit pairs comprising the conductor 450 and SiO 452.

Continuing to block 324 "form source lines in the memory array region" source lines 454 are formed in the memory array region 446 by filling the slits 448. In some embodiments, slits 448 can be filled to form source lines 454 in memory array region 446 while SL contacts 456 are formed on the source lines 454. FIG. 4F illustrates a top view of the structure showing the slits 448 filled to form source lines 454 while FIG. 4AG and FIG. 4AH illustrate cut-away side views of the structure along cuts 418 and 420, respectively, showing the slits 448 filled to form source lines 454 in memory array region 446.

Continuing to block 326 "pattern word line contact holes" word line contact holes 458 are patterned in the structure. In some embodiments, the deep word line contact holes 458 can be patterned through mold material 432 to couple word lines of stack 408 of unit pair 410 with control circuitry (not shown) while shallow word line contact holes 458 can be patterned to couple word lines of mold material stack 438 of unit pair 410 with control circuitry. FIG. 4AI illustrates the structure with memory array region 446 having word line contact holes 458 patterned therein to provide access to the L-type structure of stack 408 as well as stack 438.

Continuing to block 328 "fill word line contact holes with a conductor" word line contact holes 458 are filled with an L-shaped conductor 460 (e.g., titanium nitride (TiN), W, etc.) to provide electrical contact between metal lines formed during a back end of line (BEOL) processing to couple the memory cells within memory array region 446 to control circuitry for the 3D memory device 400. For example, FIG. 4AJ illustrates the 3D memory device 400 showing word line contact holes filled with L-shaped conductors 460.

FIG. 5 illustrates a semiconductor manufacturing system 500 comprising a controller 502 and semiconductor process tool(s) 504. Controller 502 is communicatively (e.g., electrically or wirelessly) coupled to semiconductor process tool(s) 504 and arranged to receive signals from semiconductor process tool(s) 504 and to communicate control signals to semiconductor process tool(s) 504. In general, semiconductor process tool(s) 504 operates on target 516 (e.g., to form a 3D memory device having L-type structures in the stacks of unit pairs). Semiconductor process tool(s)

504 may further include various components (not shown) to support manufacturing of semiconductor devices such as 3D memory device 100, 3D memory device 200, 3D memory device 400, or the like. Additionally, semiconductor process tool(s) 504 can be multiple tools not housing in a single housing (despite a single tool being depicted in this FIG. 5.

In some embodiments, semiconductor process tool(s) 504 can be controlled by a computing device, such as, controller 502. Controller 502 can be any of a variety of computing devices, such as, a workstation, a laptop, a server, or the like. In some embodiments, controller 502 and Semiconductor process tool(s) 504 are integrated into the same enclosure or housing. In other embodiments, controller 502 and Semiconductor process tool(s) 504 are separate devices. In general, controller 502 is arranged to control the process of manufacturing a semiconductor device, such as, formation of the trenches 404 and/or trench 428 as well as word line contact holes 458 as described herein. The controller 502 may include processor 506, memory 508, control circuitry 510, and input/output devices 518. Processor 506 can be electrically coupled to memory 508 and arranged to execute computer-executable instructions, such as, instructions 512 to facilitate processing target 516 and particularly implanting protons into target 516.

Controller 502 can also include control circuitry 510, such as hardware for monitoring proton implant processing via sensors (not shown) in Semiconductor process tool(s) 504. To facilitate control of the Semiconductor process tool(s) 504 described above, processor 506 may be one of any form of general-purpose computer processor that can be used in an industrial setting, such as a programmable logic controller (PLC), for controlling various chambers and sub-processors, a field-programmable gate-array (FPGA), an application integrated circuit (ASIC), a commercial central processing unit (CPU) having one or more processing cores. Memory 508 can be non-transitory memory and may be one or more of readily available memory such as random access memory (RAM), read only memory (ROM), floppy disk drive, hard disk, solid-state drive, flash memory, or the like. Memory 508 can store instructions 512, which are executable by memory 508 as well as proton implant process parameters 514, which can include information such as the energy and dose for each iteration of a multi-iteration proton implant process as described herein.

The instructions 512 stored in memory 508 are in the form of a program product or a computer-readable storage medium, that can cause circuitry (e.g., processor 506) to implement the methods of the present disclosure when executed. FIG. 6 illustrates computer-readable storage medium 600. Computer-readable storage medium 600 may comprise any non-transitory computer-readable storage medium or machine-readable storage medium, such as an optical, magnetic or semiconductor storage medium. In various embodiments, computer-readable storage medium 600 may comprise an article of manufacture. In some embodiments, computer-readable storage medium 600 may store computer executable instructions 602 with which circuitry (e.g., memory 508, control circuitry 510, or the like) can execute. For example, computer executable instructions 602 can include instructions to implement operations described with respect to method 300 and/or instructions 512. Examples of computer-readable storage medium 600 or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions 602 may include any suitable type of code, such as source code, compiled code, interpreted code, executable code, static code, dynamic code, object-oriented code, visual code, and the like.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the 3D memory device 100, 3D memory device 200, 3D memory device 400, etc. (e.g., as described herein). Data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper." "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of embodiments. Those skilled in the art will envision other modifications within the scope and spirit of the claims appended hereto.

What is claimed is:

1. A three-dimensional (3D) memory device, comprising:
   a first layer comprising a first trench having a first width;
   a first plurality of unit pairs disposed inside the first trench;
   a second layer disposed over the first layer, the second layer comprising a second trench having a second width smaller than the first width;
   a second plurality of unit pairs disposed inside the second trench; and
   a memory array formed from the first plurality of unit pairs and the second plurality of unit pairs, wherein conductors associated with the first plurality of unit pairs and the second plurality of unit pairs each are exposed on a top surface of the 3D memory device.

2. The 3D memory device of claim 1, the unit pairs comprising at least one conductor and at least one insulator.

3. The 3D memory device of claim 2, comprising a plurality of L-shaped conductors, each of the plurality of L-shaped conductors to couple to a respective one of the at least one conductor of the first plurality of unit pairs and the second plurality of unit pairs.

4. The 3D memory device of claim 3, comprising a plurality of contacts disposed on a surface of the second layer, the plurality of contacts coupled to the L-shaped conductors.

5. The 3D memory device of claim 1, wherein the first plurality of unit pairs comprises between 10 and 10,000 unit pairs each having a first thickness and the second plurality of unit pairs comprises between 10 and 10,000 unit pairs each having a second thickness.

6. The 3D memory device of claim 5, wherein a depth of the first trench is substantially equal to a number of unit pairs in the first plurality of unit pairs multiplied by the first thickness and wherein a depth of the second trench is substantially equal to a number of unit pairs in the second plurality of unit pairs multiplied by the second thickness.

7. The 3D memory device of claim 6, wherein the first thickness is substantially equal to the second thickness and wherein the number of unit pairs in the first plurality of unit pairs equals the number of unit pairs in the second plurality of unit pairs.

8. The 3D memory device of claim 7, wherein the width of the first trench comprises a length of the memory array plus the number of unit pairs in the first plurality of unit pairs multiplied by the first thickness multiplied by four (4) and wherein the width of the second trench comprises the length of the memory array plus the number of unit pairs in the second plurality of unit pairs multiplied by the second thickness multiplied by two (2).

9. The 3D memory device of claim 1, wherein the memory array comprises a dynamic random-access memory (DRAM) array or a not and (NAND) memory array.

* * * * *